United States Patent [19]

Avanic et al.

[11] Patent Number: 5,654,676
[45] Date of Patent: Aug. 5, 1997

[54] SHIELDED VCO MODULE HAVING TRIMMABLE CAPACITOR PLATE EXTERNAL TO SHIELD

[75] Inventors: Branko Avanic, Miami; Anthony J. Suppelsa, Coral Springs; David C. Everest, III, Tamarac, all of Fla.

[73] Assignee: Motorola, Inc., Schaumburg, Ill.

[21] Appl. No.: 617,200

[22] Filed: Jun. 10, 1996

[51] Int. Cl.$^6$ ........................................... H03B 1/00
[52] U.S. Cl. ............... 331/67; 331/68; 331/177 R; 257/708; 257/730; 361/763
[58] Field of Search ..................... 331/68, 177 R, 331/67; 361/752, 763; 257/708, 728, 730

[56] References Cited

U.S. PATENT DOCUMENTS 3,969,640 7/1976 Staudte ........................... 331/116 FE
5,172,077 12/1992 Funada ................................... 331/67

*Primary Examiner*—Siegfried H. Grimm
*Attorney, Agent, or Firm*—Barbara R. Doutre

[57] ABSTRACT

A voltage controlled oscillator module (100) (400) provides tuning capability for the VCO in a shielded environment. The module includes a trimmable capacitor (110) (410) having metal plates (112, 114), (412, 414, 416) capacitively coupled through the substrate. One of the metal plates (114) (416) is a trimmable plate which can be trimmed to tune the VCO frequency. The trimmable metal plate (114) (416) remains exposed on the bottom surface (108) (408) of the substrate (104) (404) so that the frequency of the VCO can be tuned while the reminder of the oscillator circuitry (102) (402) on the top surface (106) (406) is encapsulated by a ground shield (116) (418).

10 Claims, 6 Drawing Sheets

1

SHIELDED VCO MODULE HAVING TRIMMABLE CAPACITOR PLATE EXTERNAL TO SHIELD

TECHNICAL FIELD

This invention relates in general to voltage controlled oscillators and more specifically to the packaging of voltage controlled oscillators.

BACKGROUND

With today's portable communication products becoming smaller and more compact, the designs for these products, from both an electrical and mechanical perspective, are moving towards miniaturization. The miniaturization of both electrical and mechanical components to accommodate limited space constraints has lead to an increase in issues relating to radio performance.

An example of the space constraint issue associated with miniaturization becomes apparent in voltage controlled oscillator (VCO) technology. Voltage controlled oscillator circuits provide the operating frequencies with which communications products transmit or receive signals. In portable radio applications, a voltage controlled oscillator usually employs a frequency tuning element to tune its operating frequency. The oscillator is typically shielded using a metalized can to maintain the stability of the tuned frequency as well as to protect the VCO from picking up noise which can degrade the radio performance. The noise performance specifications associated with a VCO module are critical to the performance of a radio. Frequency trimming is necessary to obtain the highest performing phase noise oscillators. By trimming the VCO frequency, the proper centering of the VCO frequency can be accomplished. Unfortunately, the metalized can itself creates design problems related to the frequency tuning of the VCO which must be addressed by circuit designers.

As is well known, the narrower the bandwidth of the oscillator, the better the noise performance. A disadvantage associated with today's VCO modules is that the metalized can shifts the center frequency of the VCO. This forces designers to design the VCO to operate at a different center frequency taking into account the amount of shift that will occur when the can is placed over the oscillator circuit. In order to accommodate for error margins, designers must provide extra bandwidth in the VCO design. However, increasing the bandwidth of the VCO degrades noise performance.

Another way circuit designers address the issue of frequency shift in VCO modules is to include a window or hole in the metalized can through which the tuning element can be accessed. However, the smaller size constraints of today's portable communications products make this option less feasible. The window must be large enough to access the component which, if left uncovered, can negate the effects of the shield. Placing a cover over the window after tuning the VCO requires an extra step in the processing of the module and increases the parts count.

Accordingly, there is a need for an improved voltage controlled oscillator module which eases the tuning of such devices.

DETAILED DESCRIPTION OF THE PREFERRED EMBODIMENT

Figure 1:
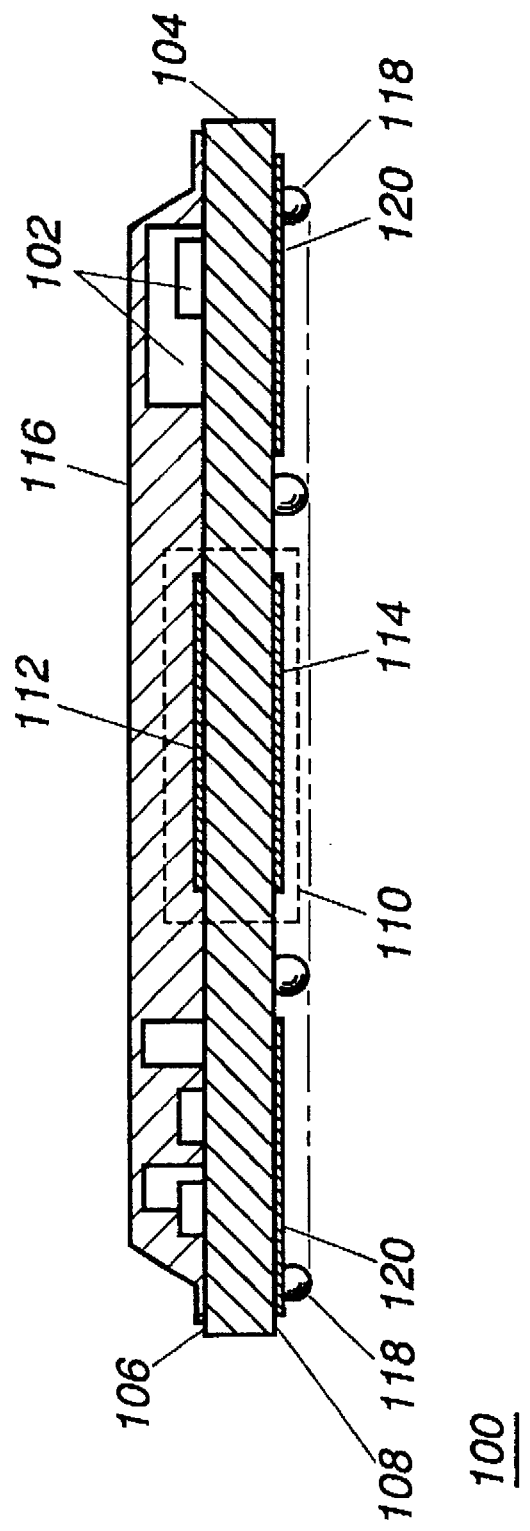
FIG. 1 is a cross sectional view of a voltage controlled oscillator module in accordance with a first embodiment of the invention.

In accordance with the present invention, a voltage controlled oscillator (VCO) module, to be described herein, provides tuning capability of the VCO frequency while providing full shielding protection to the VCO. Referring now to FIG. 1, there is shown an assembly for a voltage controlled oscillator (VCO) module 100 in accordance with a first embodiment of the invention. Module 100 includes VCO circuitry 102 deposited on a substrate 104, preferably a ceramic substrate, having top and bottom surfaces 106, 108 respectively. Included within the VCO circuitry 102 is a trimmable capacitor 110, preferably formed of first and second metalized plates 112, 114 disposed on the top and bottom surfaces 106, 108 of the substrate 104. The first metal plate 112 is coupled to ground on the top surface of the substrate 104 to provide a ground plate for trimmable capacitor 110. This first metal plate 112 will also be referred to as metalized ground plate 112 or simply as ground plate 112. A ground shield 116 encapsulates the VCO circuitry 102 on the substrate's top surface 106. The second metal plate 114 of capacitor 110, disposed on the substrate's bottom surface 108, is preferably formed of a soft metal capable of being trimmed using well known trimming techniques, such as laser trimming. Second metal plate 114 will also be referred to as trimmable metal plate 114.

In accordance with the present invention, capacitor 110 provides tuning capability of the shielded VCO module 100. The first and second metal plates 112, 114 disposed on the substrate's top and bottom surfaces 106, 108 respectively are capacitively coupled through the substrate 104. Capacitor 110 is thus formed of the ground plate 112 disposed on the substrate's top surface 106 capacitively coupled to the trimmable metal plate 114 disposed on the substrate's bottom surface 108. The trimmable metal plate 114 remains exposed on the bottom surface 108 so that the capacitor 110 can be trimmed to tune the frequency of the VCO. Hence, the VCO module 100 can be tuned with the ground shield 116 covering the top surface 106 of the substrate 104. By tuning the VCO module 100 with the full ground shield 116 in place, the issue of frequency shift associated with prior art VCO modules is minimized. Module 100 also includes a ground plane 120 distributed about the trimmable metal plate 114 on the bottom surface 108 of the substrate 104. This ground plane 120 allows the trimmable metal plate 114 to be self-shielded. Module 100 further includes interconnecting leads, such as solder balls or bumps, 118 to attach the VCO to a radio circuit board (not shown).

Figure 2:
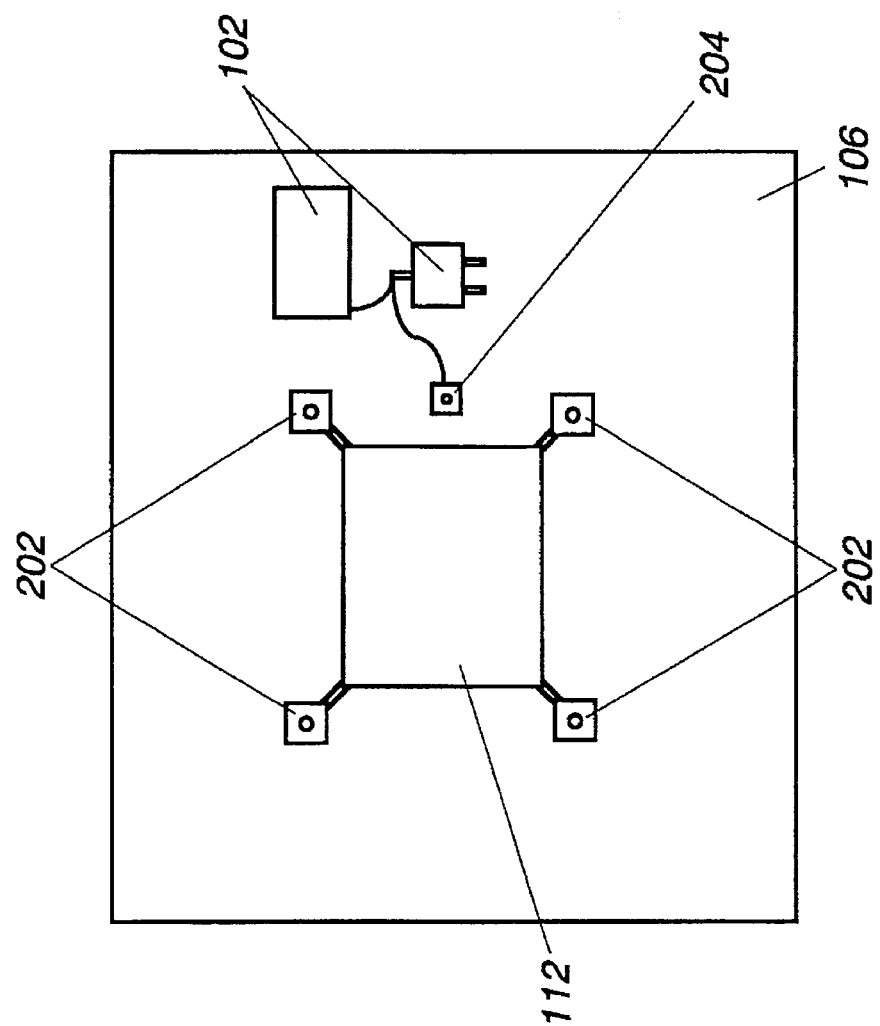
FIG. 2 is a top view of the voltage controlled oscillator module shown in FIG. 1 without the shield.
Figure 3:
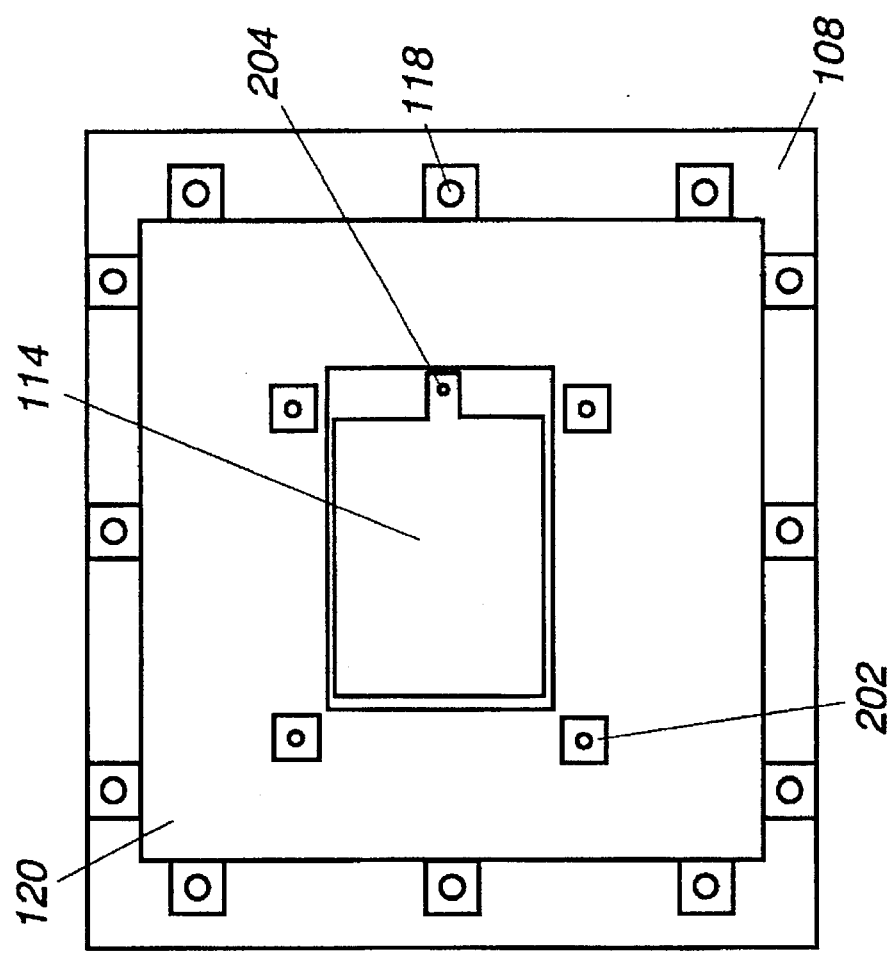
FIG. 3 is a bottom view of the voltage controlled oscillator module shown in FIG. 1 without the shield.

Referring now to FIGS. 2 and 3 there are shown the top and bottom views respectively of the substrate 104 without the shield. The substrate's top surface 106 is shown in FIG. 2 and the substrate's bottom surface 108 is shown in FIG. 3. The first metal plate 112 disposed on the substrate's top surface 106 is coupled to ground, preferably through ground vias 202, which couple to the ground plane 120 distributed about the second metal plate 114 on the substrate's bottom surface 108. Another via or metalized through-hole 204 is used to couple the second metal plate 114 back through the substrate 104 to the top surface 106 for coupling the capacitor 110 to the remaining VCO circuitry 102. The second plate 114 is preferably surrounded by ground plane 120 on the bottom surface 108 to provide additional shielding.

Figure 4:
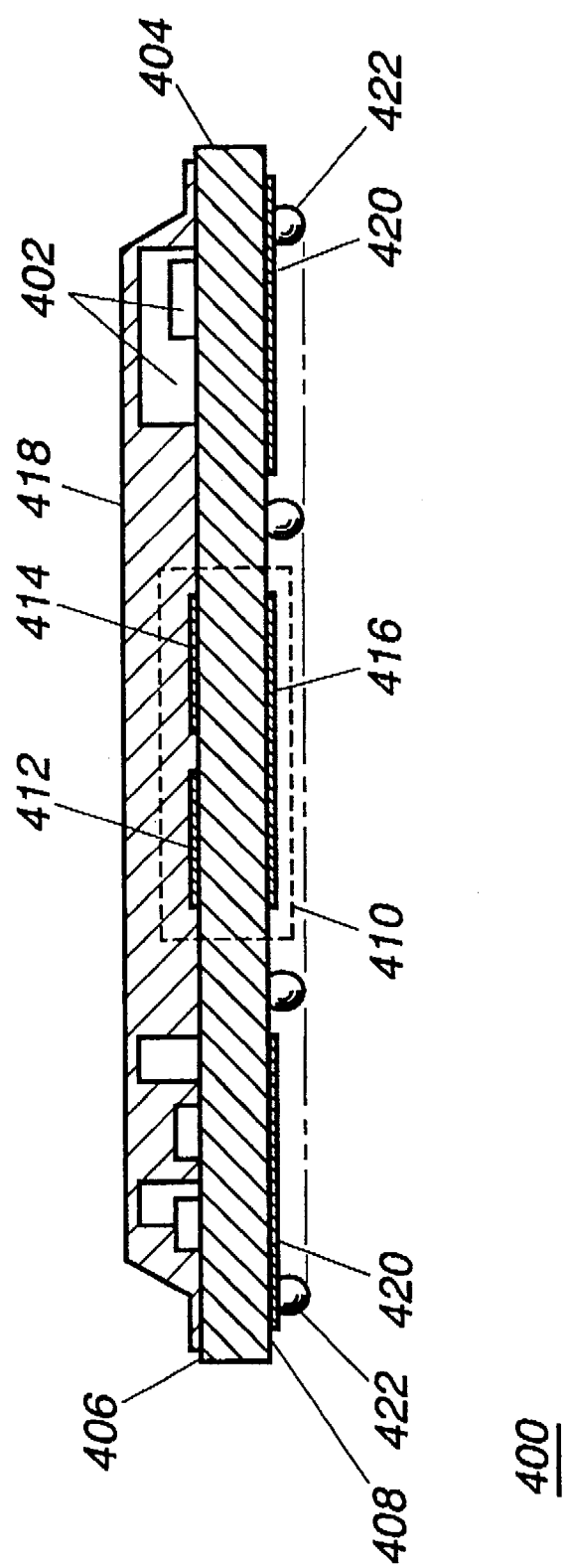
FIG. 4 is a cross sectional view of a voltage controlled oscillator module in accordance with a second embodiment of the invention.

Referring now to FIG. 4, there is shown a cross sectional view of a second embodiment for the assembly of a VCO module 400 in accordance with the invention. Here again, the assembly for the voltage controlled oscillator module 400 provides tuning capability of the VCO frequency while providing full shielding protection to the VCO. Module 400 includes VCO circuitry 402 deposited on a substrate 404 having top and bottom surfaces 406, 408 respectively. Included within the VCO circuitry 402 is a trimmable capacitor 410, which in this second embodiment of the invention comprises first, second, and third metal plates 412, 414, and 416 respectively. The first and second metal plates 412, 414 are disposed on the substrate's top surface 406. The third metal plate 416 is disposed upon the substrate's bottom surface 408. A ground shield 418 encapsulates the VCO circuitry 402 on the substrate's top surface 406. The third plate 416 is preferably formed of a soft metal which can be trimmed using well know trimming techniques. The third metal plate 416 will also be referred to as a trimmable metal plate 416.

In accordance with the present invention, trimmable metal plate 416 provides the capacitor 410 with the capability of being trimmed from the bottom surface 408 of the substrate 404. The trimmable capacitor 410 of this second embodiment of the invention interconnects to the VCO circuitry 402 without the use of the via used in the previous embodiment. In this second embodiment of the trimmable capacitor, the first metal plate 412 provides a ground plate which is capacitively coupled to the trimmable metal plate 416 disposed on the substrate's bottom surface 408 while the trimmable metal plate is capacitively coupled to the second metal plate 414 to provide an interconnect pad to the VCO circuitry 402 on the top surface 406 of the substrate 404.

In accordance with the present invention, trimmable capacitor 410 provides tuning capability for the VCO external to the shield. The first and second metal plates 412, 414 disposed on the substrate's top surface 406 are each capacitively coupled through the substrate 404 to the third metal plate, the trimmable metal plate 416. The trimmable metal plate 416 remains exposed on the bottom surface of the substrate 404 so that the capacitor 410 can be trimmed to tune the frequency of the VCO. Because the VCO module 400 of the present invention can be tuned with the full ground shield 418 in place, the issue of frequency shift associated with prior art VCO modules is minimized. Module 400 preferably includes a ground plane 420 distributed about the trimmable metal plate 416 to provide a self shielded trimmable metal plate 416. VCO module 400 further includes interconnecting leads, such as solder balls or bumps, 422 to attach the VCO module to a radio circuit board (not shown). The substrate 404, while preferably a ceramic, can be formed of any material deemed appropriate by circuit designers for VCO applications, such as printed circuit board materials. Well known circuit board techniques can be used to integrate the trimmable capacitor 410 into the substrate surfaces.

Figure 5:
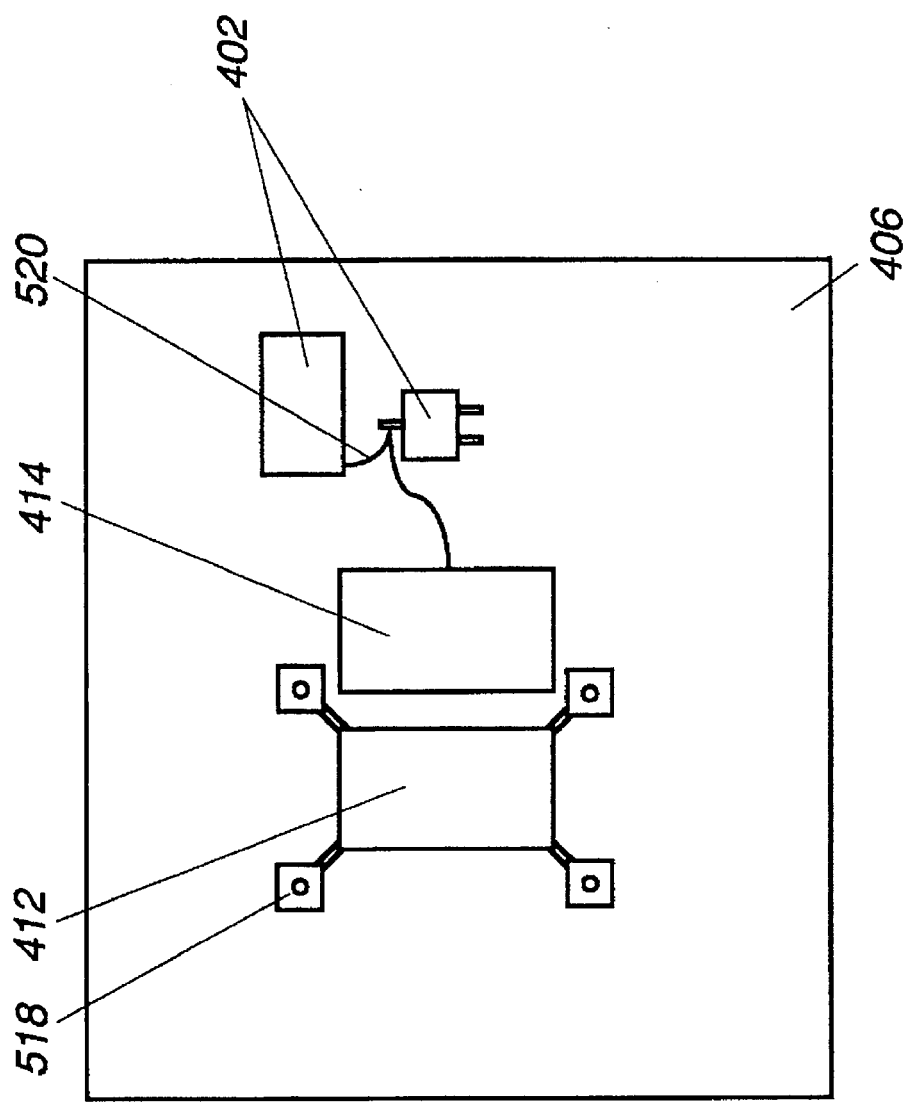
FIG. 5 is a top view of the voltage controlled oscillator module shown in FIG. 4 without the shield.
Figure 6:
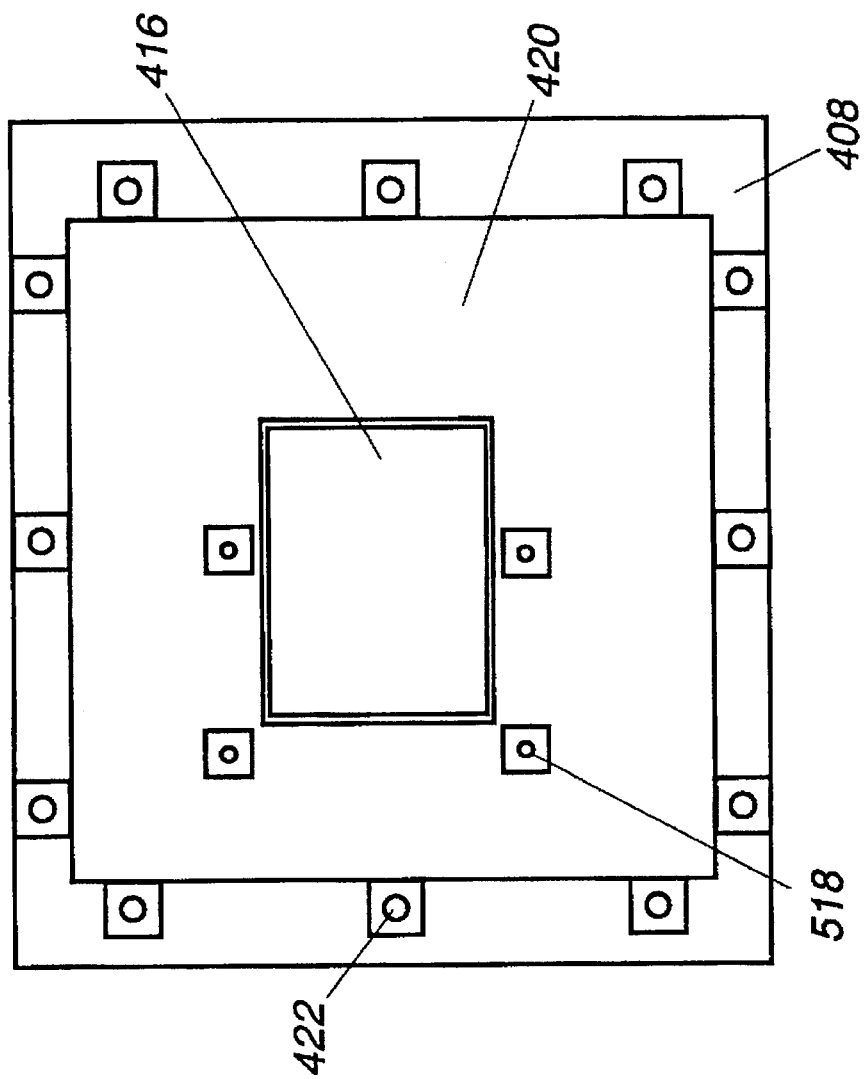
FIG. 6 is a bottom view of the voltage controlled oscillator module shown in FIG. 4 without the shield.

Referring now to FIGS. 5 and 6, there are shown the top and bottom views respectively without the shield. FIG. 5 shows the substrate's top surface 406 while FIG. 6 shows the substrate's bottom surface 408. FIG. 5 shows how the first metal plate 412 is coupled to ground, preferably through ground vias or through-holes 518, while the second metal plate 414 is coupled, preferably through a trace line 520, directly to the VCO circuitry 402. FIG. 6 shows the bottom surface's third metal plate, trimmable metal plate, 416 surrounded by the ground plane 420 and ground vias 518. Capacitive coupling is formed between the first and third plates 412, 416 as well as the second and third plates 414, 416 to provide for series coupled capacitance. The trimmable capacitor 410 of the second embodiment eliminates the need for a via to interconnect to the VCO circuitry 402. Trimming the third metal plate 416 controls the capacitive coupling which tunes the frequency of the VCO.

Accordingly, there has been provided a VCO module which provides tuning capability in a shielded environment. Both the first and second embodiments have provided a trimmable capacitor having a trimmable metal plate accessible from the bottom surface of the substrate while maintaining a shielded environment. While the VCO module has been described showing at least one trimmable capacitor operating as the tuning element for the VCO, one skilled in the art can appreciate that a plurality of trimmable capacitors could also be used. For example, dual oscillator configurations having independent tuning elements could integrate separate trimmable capacitors having separate trimmable plates on the bottom surface of the module's substrate. The VCO module assembly described by the invention minimizes the problems of frequency shift associated with prior art VCO modules. Designers can now design VCO circuits with narrower frequency bandwidths for improved noise performance. The elimination of the tuning window in the shield avoids disturbing field coupling within the shield. The elimination of a tuning window provides the further advantage of reducing parts count and labor making the VCO module described by the invention a cost effective solution in the design of VCOs.

Numerous modifications, changes, variations, substitutions, and equivalents will occur to those skilled in the art without departing from the spirit and scope of the present invention as defined by the appended claims.

What is claimed is:

1. A voltage controlled oscillator (VCO) module, comprising:

a substrate having top and bottom surfaces;

VCO circuitry located on the top surface of the substrate;

a shield coupled to the substrate for shielding the VCO circuitry;

a metalized ground plate disposed on the top surface of the substrate;

a trimmable metal plate located on the bottom surface of the substrate and capacitively coupled to the metalized ground plate, said trimmable metal plate and metalized ground plate providing a trimmable capacitor for tuning a frequency of the VCO module;

a via coupled to the trimmable metal plate, said via feeding through the substrate to couple to the VCO circuitry; and a ground plane disposed about the trimmable metal plate on the bottom surface of the substrate and interconnected to the metalized ground plate on the top surface of the substrate.

2. A voltage controlled oscillator (VCO) module, comprising:

a substrate having top and bottom surfaces;

VCO circuitry including at least one trimmable capacitor, each trimmable capacitor being capacitively coupled between the top and bottom surfaces of the substrate and including a trimmable metal plate disposed on the bottom surface of the substrate for controlling the capacitive coupling; and a shield coupled to the top surface of the substrate for shielding the VCO circuitry.

3. A VCO module as described in claim 2, wherein the capacitive coupling controlled by each trimmable metal plate tunes the VCO frequency.

4. A VCO module as described in claim 2, wherein each trimmable capacitor comprises:

a ground plate disposed on the top surface of the substrate, said ground plate being capacitively coupled to the trimmable metal plate of the bottom surface; and a via coupled to the trimmable metal plate, said via feeding through the substrate to couple to the VCO circuitry.

5. A VCO module as described in claim 2, wherein each trimmable capacitor comprises:

first and second metal plates disposed on the top surface of the substrate, each of the first and second metal plates being capacitively coupled to the trimmable metal plate on the bottom surface, the first metal plate being electrically coupled to ground and the second metal plate being electrically coupled to the VCO circuitry.

6. A voltage controlled oscillator (VCO) module, comprising:

a substrate having first and second surfaces;

VCO circuitry disposed on the substrate including a trimmable capacitor, said trimmable capacitor being formed of:

a first metal plate disposed on the first surface of the substrate and electrically coupled to ground;

a second metal plate disposed on the first surface of the substrate and electrically coupled to the VCO circuitry; and a third metal plate disposed on the second surface of the substrate, said third metal plate capacitively coupling to the first metal plate and the second metal plate, said third metal plate being trimmable for controlling the capacitive coupling; and a ground shield coupled to the first surface of the substrate for shielding the VCO circuitry.

7. A voltage controlled oscillator (VCO) module, comprising:

a substrate having top and bottom surfaces;

VCO circuitry disposed on the substrate, said VCO circuitry including:

a trimmable capacitor for tuning a frequency of the VCO, said trimmable capacitor comprising first and second capacitively coupled metal plates, the first metal plate being electrically coupled to ground on the top surface of the substrate and the second metal plate being disposed on the bottom surface of the substrate and electrically coupled the VCO circuitry; and a ground shield coupled to the first surface of the substrate for shielding the VCO circuitry while said second metal plate is left exposed for tuning the frequency of the VCO.

8. A voltage controlled oscillator (VCO) module, comprising:

a substrate having top and bottom surfaces;

VCO circuitry disposed on the top surface of the substrate;

a shield disposed on the top surface of the substrate for shielding the VCO; and a trimmable capacitor having a trimmable metal plate disposed on the bottom surface of the substrate, the trimmable metal plate coupled to the VCO circuitry for controlling the tuning frequency of the shielded VCO.

9. A VCO module as described in claim 8, wherein the trimmable metal plate is coupled to the VCO circuitry through a via.

10. A VCO module as described in claim 8, wherein the trimmable metal plate is capacitively coupled to the VCO circuitry.

\* \* \* \* \*